United States Patent
Huang et al.

(10) Patent No.: US 8,839,182 B2
(45) Date of Patent: Sep. 16, 2014

(54) SYSTEM AND METHOD FOR CHECKING SIGNAL TRANSMISSION LINE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Ya-Ling Huang, Shenzhen (CN); Chia-Nan Pai, New Taipei (TW); Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/966,264

(22) Filed: Aug. 13, 2013

(65) Prior Publication Data

US 2014/0196000 A1    Jul. 10, 2014

(30) Foreign Application Priority Data

Jan. 8, 2013   (CN) .................. 2013 1 00057306

(51) Int. Cl.
   *G06F 17/50*   (2006.01)
(52) U.S. Cl.
   CPC .................. *G06F 17/5081* (2013.01)
   USPC ............ 716/136; 716/111; 716/132; 716/137

(58) Field of Classification Search
   USPC .................. 716/111, 132, 136–137
   See application file for complete search history.

(56) References Cited

U.S. PATENT DOCUMENTS

| | | | | |
|---|---|---|---|---|
| 6,052,516 | A * | 4/2000 | Tajima ..................... | 716/123 |
| 6,434,726 | B1 * | 8/2002 | Goossen ..................... | 333/246 |
| 7,441,222 | B2 * | 10/2008 | Mathews ..................... | 716/50 |
| 8,384,491 | B2 * | 2/2013 | Hsieh et al. ..................... | 333/4 |
| 8,423,938 | B2 * | 4/2013 | Tsubamoto ..................... | 716/113 |
| 2005/0246671 | A1 * | 11/2005 | Bois et al. ..................... | 716/5 |
| 2013/0118790 | A1 * | 5/2013 | Fan et al. ..................... | 174/260 |
| 2013/0158925 | A1 * | 6/2013 | Huang et al. ..................... | 702/82 |
| 2013/0159959 | A1 * | 6/2013 | Byrne et al. ..................... | 716/137 |
| 2013/0254730 | A1 * | 9/2013 | Ou et al. ..................... | 716/112 |

\* cited by examiner

*Primary Examiner* — Naum Levin
(74) *Attorney, Agent, or Firm* — Novak Druce Connolly Bove + Quigg LLP

(57) ABSTRACT

A method for checking signal transmission lines of a printed circuit board (PCB) layout includes determining differential pairs to be checked and dividing the differential pairs to be checked into a first group and a second group. A first reference distance between differential pairs belonging to the same group and a second reference distance between differential pairs belonging to different groups are set. A first box surrounding each line section of one to be checked signal differential line of the first group and a second box surrounding the first box are created. One first box surrounding each line section of the to be checked differential line of the second group is created. Whether or not in the first box and the second box there are differential lines which do not satisfy design standards is determined.

15 Claims, 5 Drawing Sheets

SYSTEM AND METHOD FOR CHECKING SIGNAL TRANSMISSION LINE

BACKGROUND

1. Technical Field

Embodiments of the present disclosure relates to circuit simulating systems and methods, and more particularly, to a system and a method for checking the distance between two differential pairs in a printed circuit board (PCB) layout.

2. Description of Related Art

In a PCB layout, for high-speed differential lines, the distance between two differential pairs laid in two adjacent signal layers should satisfy design standards. However, checking the distance between two differential pairs laid in two adjacent signal layers is often done visually by a technician, which is not only time-consuming, but also error-prone.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
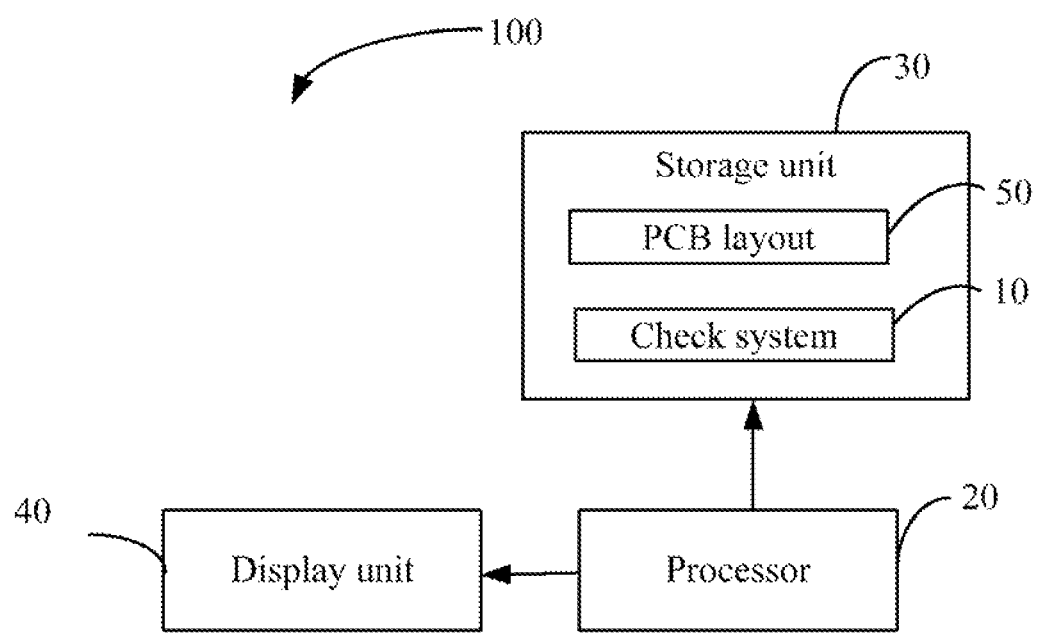
FIG. 1 is a block diagram of one embodiment of a computing device for checking signal transmission lines of a PCB layout.

FIG. 1 is a block diagram of one embodiment of a computing device 10. The computing device 10 includes a processor 20, a storage unit 30, and a display unit 40. The storage unit 30 may be a computer, a smart media card, a secure digital card, or a flash card. The storage unit 30 stores computerized codes of a check system 10 and at least one PCB layout 50. The check system 10 includes various software components and/or set of instructions, which may be implemented by the processor 20 to check whether or not the distance between two differential pairs laid in two adjacent signal layers of one displayed PCB layout 50 satisfies design standards, and marks differential lines which do not satisfy design standards.

Figure 2:
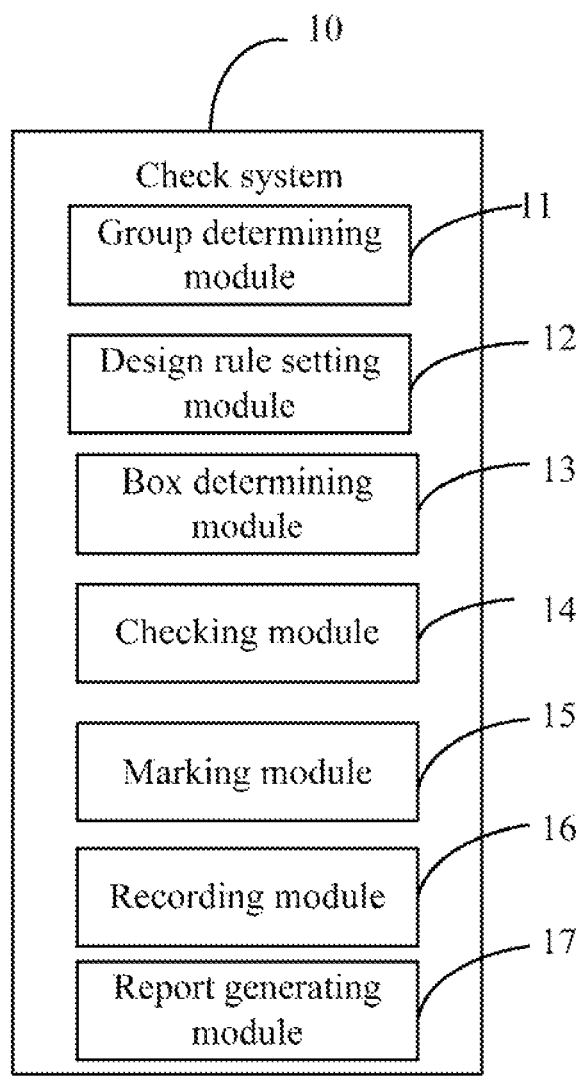
FIG. 2 is a block diagram of one embodiment of function modules of a check system in the computing device of FIG. 1.

FIG. 2 is a block diagram of the function modules of the check system 10 in the computing device 100 of FIG. 1. In one embodiment, the check system 10 includes a group determining module 11, a design rule setting module 12, a box determining module 13, a checking module 14, a marking module 15, a recording module 16, and a report generating module 17.

Figure 4:
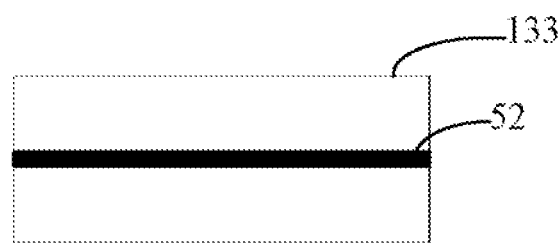
Figure 5:
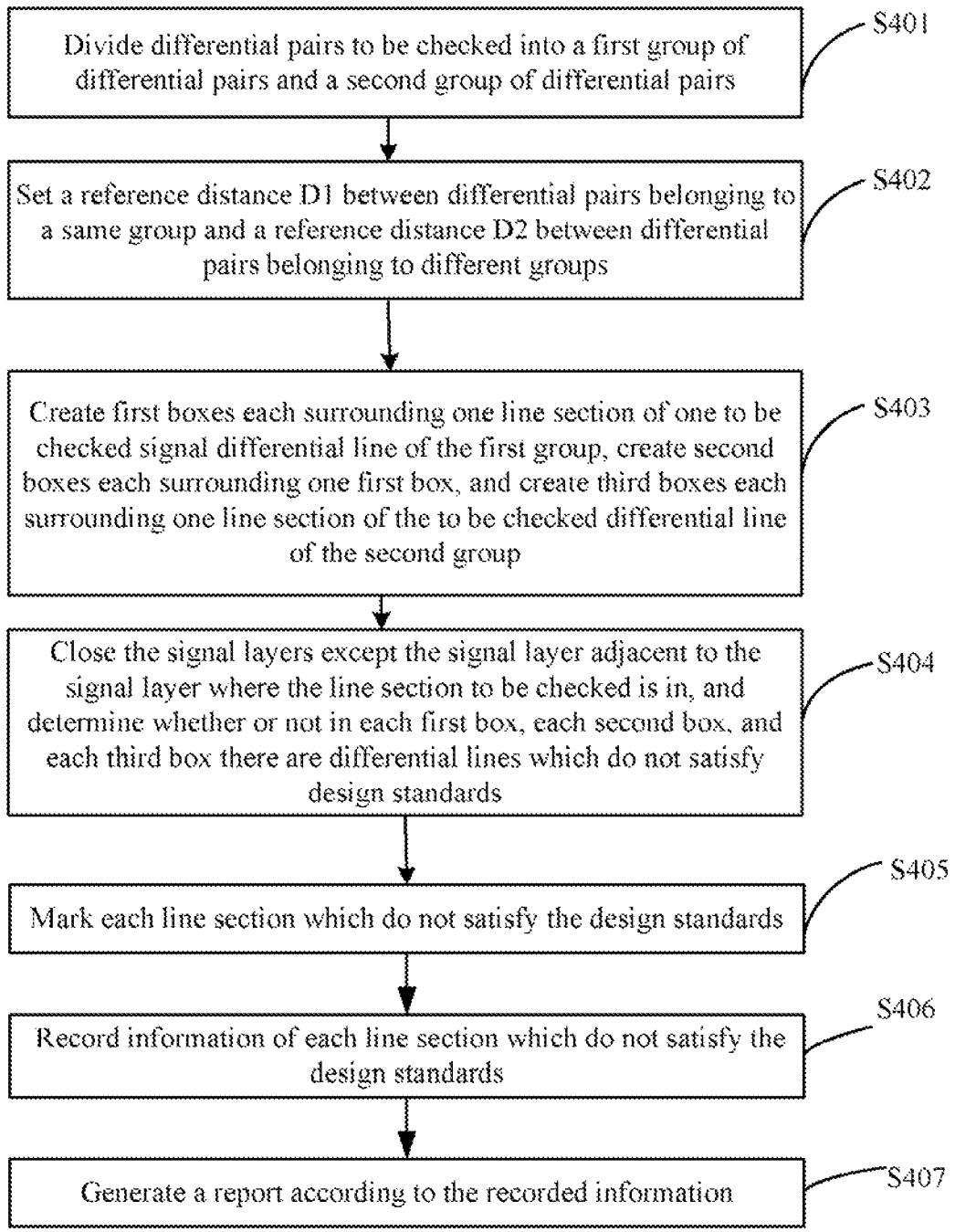
FIG. 5 is a flowchart of one embodiment of a method for checking signal transmission lines of a PCB layout.

FIG. 4 is a flowchart of a method for checking signal transmission lines, in accordance with an exemplary embodiment.

In step S401, the group determining module 11 determines differential pairs to be checked in one PCB layout 50 displayed on the display unit 40, and divides the differential pairs to be checked into a first group of differential pairs and a second group of differential pairs according to a preset rule. In this embodiment, the group determining module 11 divides the differential pairs to be checked into the first group of differential pairs and the second group of differential pairs according to the transmission directions of the differential pairs to be checked. The transmission directions of the first group of differential pairs are the same, and the transmission directions of the second group of differential pairs are the same and different from the transmission directions of the first group of differential pairs. In an alternative embodiment, the group determining module 11 divides the differential pairs to be checked into different groups according to the transmission rate of the differential pairs to be checked.

In step S402, the design rule setting module 12 responds to user input to set a reference distance D1 between differential pairs belonging to a same group and a reference distance D2 between differential pairs respectively belonging to the first group and the second group.

Figure 3:
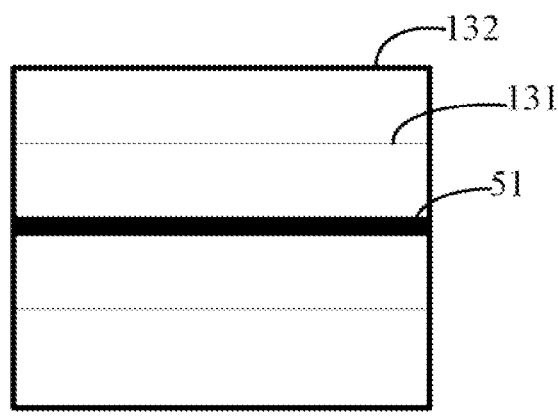
FIGS. 3-4 is a schematic view of boxes used for checking signal transmission lines.

In step S403, the box determining module 13 creates a number of first boxes 131 each surrounding one line section of one to be checked signal differential line of the first group, and creates a number of second boxes 132 each surrounding the first box 131 (see FIG. 3). The length of each first box 131 is the same as the corresponding line section 51 in the first box 131, and the width of each first box 131 is the total of the width of the line section 51 in the first box 131 and twice of the reference distance D1. The length of each second box 132 is the same as the corresponding first box 131 surrounded by the second box 132, and the width of the second box 132 is the total of the width of the line section 51 in the first box 131 and twice of the reference distance D2. The line section 51 is the symmetry axis of the first box 131 and the second box 132. Furthermore, the box determining module 13 creates a number of third boxes 133 each surrounding one line section 52 of the to be checked differential line of the second group (see FIG. 4). The length of each third box 133 is the same as the corresponding line section 52 in the third box 133, and the width of each third box 133 is the total of the width of the line section 52 in the second box 133 and twice of the reference distance D1.

In step S404, when one line section 51 needs to be checked, the checking module 14 closes signal layers of the PCB 50 except the signal layer adjacent to the signal layer where the line section 51 to be checked is in, and determines whether or not in each first box 131 and each second box 132 there are differential lines which do not satisfy design standards, and when one line section 52 needs to be checked, the checking module 14 closes signal layers of the PCB 50 except the signal layer adjacent to the signal layer where the line section 52 to be checked is in, and determines whether or not in each third box 133 there are differential lines which do not satisfy the design standards. In detail, when one line section of the first group needs to be checked, the checking module 14 closes the signal layers except the signal layer adjacent to the signal layer where the line section to be checked is in, determines whether or not in each first box 131 there are other line sections belong to the first group or the second group, and determines each of the determined other line sections and the line section to be checked is a pair of line sections which do not satisfy the design standards. The checking module 14 further determines whether or not in each second box 132 there are other line sections belonging to the second group, and determines each determined other line section and the line section to be checked in the second box 132 is a pair of line sections which do not satisfy the design standards. When one line section of the second group needs to be checked, the checking module 14 determines whether or not in the third box 133 there are other line sections belonging to the second group, and determines each determined other line section and the line section to be checked in the third box is a pair of line sections which do not satisfy the design standards.

In step S405, the marking module 15 marks each line section which does not satisfy the design standards in the PCB.

In step S406, the recording module 16 records information of each line section which does not satisfy the design standards. The information includes the signal layer each line section is laid in, the actual distance and the reference distance between each pair of line sections which does not satisfy the design standards. The actual distance between each pair of line sections which do not satisfy design standards is calculated by the checking module 14.

The report generating module 17 generates a report according to the recorded information.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-based method for checking signal transmission lines of a printed circuit board (PCB) layout, the method comprising:
   determining differential pairs to be checked in a displayed PCB layout, and dividing the differential pairs to be checked into a first group of differential pairs and a second group of differential pairs according to a preset rule using a computer device;
   responding to user input to set a first reference distance between differential pairs belonging to a same group and a second reference distance between differential pairs respectively belonging to the first and second groups using the computer device;
   creating a plurality of first boxes each surrounding one line section of one to be checked signal differential line of the first group, and creating a plurality of second boxes each surrounding one of the first boxes when the one signal differential line of the first group needs to be checked, and further creating a plurality of third boxes each surrounding one line section of one to be checked differential line of the second group when the one signal differential line of the second group needs to be checked using the computer device, wherein the length of each first box is the same as the corresponding line section to be checked in the first box, the width of each first box is the total of the width of the line section to be checked in the first box and twice of the first reference distance, the length of each second box is the same as the corresponding first box surrounded by the second box, and the width of each second box is the total of the width of the line section to be checked in the first box and twice of the second reference distance, the length of each third box is the same as the corresponding line section to be checked in the third box, the width of each third box is the total of the width of the line section to be checked in the third box and twice of the first reference distance, the line section to be checked surrounded by each first box and each second box is the symmetry axis of the first box and the second box, and the line section to be checked surrounded by each third box is the symmetry axis of the third box; and
   closing signal layers of the displayed PCB except the signal layer adjacent to the signal layer where the line section to be checked is in, and determining whether or not in each first box, each second box, and each third box there are differential lines which do not satisfy design standards using the computer device, wherein when one line section of the first group needs to be checked, whether or not in each first box there are other line sections which belong to the first group or the second group are determined, and whether or not in each second box there are other line sections which belong to the second group are determined, each determined other line section in each first box and the line section to be checked in the first box are a pair of line sections which do not satisfy the design standards, and each determined other line section in each second box and the line section to be checked in the second box are a pair of line sections which do not satisfy the design standards; and when one line section of the second group needs to be checked, whether or not in the third box there are other line sections which belong to the second group are determined, and each determined other line section in each third box and the line section be checked in the third box are a pair of line sections which do not satisfy the design standards.

2. The method as described in claim 1, further comprising:
   marking each line section which do not satisfy the design standards in the displayed PCB using the computer device.

3. The method as described in claim 1, further comprising:
   calculating the actual distance between the line sections of each pair of line sections which do not satisfy design standards using the computer device.

4. The method as described in claim 3, further comprising:
   recording information of each pair of line sections which do not satisfy the design standards, wherein the information comprises the signal layer each line section is laid in, the actual distance and the reference distance between the line sections of each pair of line sections which do not satisfy the design standards using the computer device.

5. The method as described in claim 4, further comprising:
   generating a report according to the recorded information using the computer device.

6. A system comprising:
   one or more computing devices; and
   one or more computer-readable media coupled to the one or more computing devices and having instructions stored thereon which, when executed by the one or more computing devices, cause the one or more computing devices to perform operations for checking signal transmission lines, the operations comprising:
   determining differential pairs to be checked in a displayed PCB layout, and dividing the differential pairs to be checked into a first group of differential pairs and a second group of differential pairs according to a preset rule;
   responding to user input to set a first reference distance between differential pairs belonging to a same group and a second reference distance between differential pairs respectively belonging to the first group and the second group;
   creating a plurality of first boxes each surrounding one line section of one to be checked signal differential line of the first group, and creating a plurality of second boxes each surrounding one first box when one signal differential line of the first group needs to be checked, and further creating a plurality of third boxes each surrounding one line section of the to be checked differential line of the second group when one signal differential line of the second group needs to be checked, wherein the length of each first box is the same as the corresponding line section to be checked in the first box, the width of each first box is the total of the width of the line section to be checked in the first box and twice of the first reference distance, the length of each second box is the same as the corresponding first box surrounded by the second box, and the width of each second box is the total of the width of the line section to be checked in the first box and twice of the second reference distance, the length of each third box is the same as the corresponding line section to be checked in the third box, the width of each third box is the total of the width of the line section to be checked in the third box and twice of the first reference distance, the line section to be checked surrounded by each first box and each second box is the symmetry axis of the first box and the second box, and the line section to be checked surrounded by each third box is the symmetry axis of the third box; and closing signal layers of the displayed PCB except the signal layer adjacent to the signal layer where the line section to be checked is in, and determining whether or not in each first box, each second box, and each third box there are differential lines which do not satisfy design standards, wherein when one line section of the first group needs to be checked, whether or not in each first box there are other line sections which belong to the first group or the second group are determined, and whether or not in each second box there are other line sections which belong to the second group are determined, each determined other line section in each first box and the line section to be checked in the first box are a pair of line sections which do not satisfy the design standards, and each determined other line section in each second box and the line section to be checked in the second box are a pair of line sections which do not satisfy the design standards; and when one line section of the second group needs to be checked, whether or not in each third box there are other lines sections which belong to the second group are determined, and each determined other line section in each third box and the line section be checked in the third box are a pair of line sections which do not satisfy the design standards.

7. The system as described in claim 6, further comprising:
marking each line section which do not satisfy the design standards in the displayed PCB.

8. The system as described in claim 6, further comprising:
calculating the actual distance between the line sections of each pair of line sections which do not satisfy the design standards.

9. The system as described in claim 8, further comprising:
recording information of each pair of line sections which do not the satisfy design standards, wherein the information comprises the signal layer each line section is laid in, the actual distance and the reference distance between the line sections of each pair of line sections which do not satisfy the design standards.

10. The system as described in claim 9, further comprising:
generating a report according to the recorded information.

11. A non-transitory computer storage medium encoded with a computer program, the program comprising instructions that when executed by one or more computers cause the one or more computers to perform operations comprising:
determining differential pairs to be checked in a displayed PCB layout, and dividing the differential pairs to be checked into a first group of differential pairs and a second group of differential pairs according to a preset rule;

responding to user input to set a first reference distance between differential pairs belonging to a same group and a second reference distance between differential pairs respectively belonging to the first and second groups;

creating a plurality of first boxes each surrounding one line section of one to be checked signal differential line of the first group, and creating a plurality of second boxes each surrounding one of the first boxes when the one signal differential line of the first group needs to be checked, and further creating a plurality of third boxes each surrounding one line section of one to be checked differential line of the second group when the one signal differential line of the second group needs to be checked, wherein the length of each first box is the same as the corresponding line section to be checked in the first box, the width of each first box is the total of the width of the line section to be checked in the first box and twice of the first reference distance, the length of each second box is the same as the corresponding first box surrounded by the second box, and the width of each second box is the total of the width of the line section to be checked in the first box and twice of the second reference distance, the length of each third box is the same as the corresponding line section to be checked in the third box, the width of each third box is the total of the width of the line section to be checked in the third box and twice of the first reference distance, the line section to be checked surrounded by each first box and each second box is the symmetry axis of the first box and the second box, and the line section to be checked surrounded by each third box is the symmetry axis of the third box; and closing signal layers of the displayed PCB except the signal layer adjacent to the signal layer where the line section to be checked is in, and determining whether or not in each first box, each second box, and each third box there are differential lines which do not satisfy design standards, wherein when one line section of the first group needs to be checked, whether or not in each first box there are other line sections which belong to the first group or the second group are determined, and whether or not in each second box there are other line sections which belong to the second group are determined, each determined other line section in each first box and the line section to be checked in the first box are a pair of line sections which do not satisfy the design standards, and each determined other line section in each second box and the line section to be checked in the second box are a pair of line sections which do not satisfy the design standards; and when one line section of the second group needs to be checked, whether or not in the third box there are other line sections which belong to the second group are determined, and each determined other line section in each third box and the line section be checked in the third box are a pair of line sections which do not satisfy the design standards.

12. The non-transitory computer storage medium as described in claim 11, further comprising:
marking each line section which do not the satisfy design standards in the displayed PCB.

13. The non-transitory computer storage medium as described in claim 11, further comprising:
calculating the actual distance between the line sections of each pair of line sections which do not satisfy the design standards.

14. The non-transitory computer storage medium as described in claim 13, further comprising:

recording information of each pair of line sections which do not satisfy the design standards, wherein the information comprises the signal layer each line section is laid in, the actual distance and the reference distance between the line sections of each pair of line sections which do not satisfy the design standards.

15. The non-transitory computer storage medium as described in claim 11, further comprising:

generating a report according to the recorded information.

* * * * *